United States Patent [19]

Nicotra et al.

[11] Patent Number: 5,373,256
[45] Date of Patent: Dec. 13, 1994

[54] PLL FREQUENCY SYNTHESIZER HAVING A MAIN LOOP AND A SECONDARY LOOP

[75] Inventors: Sebastiano Nicotra, Paderno d/Adda; Roberto Tosini, Ronco Briantino, both of Italy

[73] Assignee: Mizar S.p.A., Lomagna, Italy

[21] Appl. No.: 78,550

[22] Filed: Jun. 16, 1993

[51] Int. Cl.⁵ .................................. H03L 7/23
[52] U.S. Cl. .............................. 331/2; 331/25; 331/30
[58] Field of Search ................ 331/2, 18, 19, 25, 30

[56] References Cited

U.S. PATENT DOCUMENTS

| | | | |
|---|---|---|---|
| 3,956,703 | 5/1976 | Noordanus et al. | 328/14 |
| 4,114,110 | 9/1978 | Nossen | 331/2 |
| 4,234,929 | 11/1980 | Riley, Jr. | 331/2 X |
| 4,516,085 | 5/1985 | Effinger et al. | 331/40 |
| 4,551,689 | 11/1985 | Scala et al. | 331/2 |
| 4,763,083 | 8/1988 | Edwards | 331/2 |
| 5,128,633 | 7/1992 | Martin et al. | 331/2 |

*Primary Examiner*—Siegfried H. Grimm
*Attorney, Agent, or Firm*—Ostrolenk, Faber, Gerb & Soffen

[57] ABSTRACT

A frequency synthesis system for generating microwaves which includes a main loop with a low gain electronically tunable voltage controlled oscillator (VCO) covering the entire desired frequency bandwidth, and a secondary loop including a direct synthesis section in which frequencies are synthesized directly from a quartz reference which also controls the stability of the oscillator and an indirect synthesis section with a high gain oscillator.

3 Claims, 6 Drawing Sheets

PLL FREQUENCY SYNTHESIZER HAVING A MAIN LOOP AND A SECONDARY LOOP

BACKGROUND OF THE INVENTION

1. Field of the Invention:

The present invention relates to a system for generating high-frequency signals, in particular microwaves.

2. Description of the Prior Art

Frequency-synthesized oscillators are becoming increasingly prevalent and varied in their structure. Typically, such oscillators consist either of a direct or indirect synthesis type having a single or multiple loops. FIGS. 1 to 3 are block diagrams of these types of frequency synthesis systems.

Direct Frequency Synthesis

The simplest approach involves selecting one of a plurality of oscillators, each tuned to one of the desired frequencies, using an electronic microwave commutator.

This method can obviously be applied only when the number of frequencies to be synthesized is rather limited. FIG. 1 shows a typical circuit in which O1 ... O8 are 8 oscillators, directly obtained by quartz crystals or by multiplication, or by cavities stabilized at different frequencies. In FIG. 1, C represents 8-way commutators, L represents filters, D represents divide-by-8 dividers, A represents buffer amplifiers, M represents mixers, and P represents multipliers.

If the frequency difference between two oscillators is F, the synthesis step is F/8 and the total covered band is: $8 \times 8 \times 8 \times F/8 = 64 \times F$. The number of components necessary, as well as the cost, are particularly high, but it is possible to get a relatively high commutation speed from one frequency to another frequency, in a time under one microsecond.

Indirect Single Loop Frequency Synthesis

This approach is shown in FIG. 2. In FIG. 2, O is a microwave voltage-controlled oscillator (VCO) that covers the required frequency band, P is a prescaler (a fixed microwave divider), N and M are programmable low-frequency dividers, H is a phase and frequency comparator, R is a reference quartz oscillator, A is an amplifier and F is a filter, always at very low frequencies, necessary for assuring the stability of the phase locked loop.

By suitably programming the dividers N and M, a microwave frequency equal to $(R/M) \times N \times P$ is obtained. The performance achieved by this type of system is substantially determined by the microwave VCO used. Accordingly, to obtain the performance required by the radio-communication systems, a cavity oscillator mechanically tuned at a frequency near the required frequency with a relatively limited electronic tuning band is employed.

This type of system is relatively simple and, although it is necessary to use sophisticated technology to obtain the required performance, the total cost is not excessive. This type of system is, however, rather impractical because the system must be pre-tuned in a laboratory (it is not truly electronically adjustable), and the performance also depends on the accuracy of the mechanical pre-tuning.

Indirect Multiple Loop Synthesis

The problems of single-loop frequency synthesis noted above are solved by using a multiple-loop technique, but with the drawback of a greater circuit complexity.

FIG. 3 shows one of the many possible multiple loop circuits—for purposes of simplicity, FIG. 3 shows a three loop circuit. Oscillator O4 is a microwave VCO with a low gain factor that is electronically tunable over the entire desired frequency band. A buffer amplifier A4 is disposed between the oscillator O4 and the output of the circuit. A portion of the signal from oscillator O4 is sent to a mixer H1 through a RF isolator I1 which prevents spurious frequencies at the output.

The frequency of the signal from oscillator O4 is progressively down-shifted through the mixers H1, H2, H3 (H3 is a phase/frequency comparator which serves to close the main loop). A1, F2, A2, and F2 are amplifiers and filters at the two intermediate frequencies and A3 and F3 are, respectively, an amplifier and a low frequency filter for closing the loop.

P1 is a frequency multiplier and D1 is a frequency divider. O1, O2, and O3 are oscillators, usually running at UHF frequency, synthesized from a sufficiently small frequency, generally by an indirect single loop circuit. N1, M1, N2, M2, N3, M3 are programmable frequency dividers which are necessary to establish the frequency of oscillators O1, O2, and O3. K1, K2 and K3 are corresponding phase/frequency comparators; G1, G2 and G3 are low-frequency amplifiers; L1, L2 and L3 are loop filters. A microcontroller C1 pre-tunes the oscillator O4 at a frequency near the desired frequency using a digital/analog converter and correctly programs the programmable dividers N1, M1, N2, M2, N3 and M4.

R1 is the frequency reference generated by a quartz oscillator. Since the main loop does not include any frequency divider, the performance of oscillator O4 is not the determining factor in the performance of the overall system.

The performance of oscillator O3 is increased by the divider D1; O3 carries out a large number of frequency adjustments in small steps.

The performance of oscillator O2 directly influences the performance of the overall device, although the output of oscillator O2 is at sufficiently low frequency (hundreds of MHz) that the required results are obtained without great difficulty; O2 thus synthesizes the intermediate frequency steps.

Oscillator O4 is the most critical element as its performance influences the entire device, which is multiplied by the multiplication factor P1; oscillator O4 synthesizes a relatively small number of large frequency steps (the less critical ones) and in some cases it is preferable that it is made by direct synthesis (instead of by indirect synthesis as indicated in FIG. 3).

The mixer H1 and multiplier P1 assembly is frequently formed of a single sampling circuit (sampler) that makes the harmonic frequency conversion with equal results.

SUMMARY OF THE INVENTION

The object of the present invention is to provide an oscillator system that does not have the drawbacks of the devices of the prior art and obtains performances at least comparable if not better than indirect multiple-loop frequency synthesis oscillator systems, with a low number of components and minimal circuit complexity, and with very low waste in terms of costs, overall dimensions, maintenance, etc.

Another object of the invention is to provide a highly flexible system suitable for generating oscillation frequencies over a wide band, e.g. from UHF frequencies to high microwave frequencies, utilizing a single set of basic circuit components and requiring only the modification of the RF parts for the different frequencies.

These and other objects are achieved by the circuit of the present invention, which includes a direct synthesis section, preferably in single loop form, and an indirect synthesis section, in multiple loop form. The present invention advantageously achieves the performance of indirect frequency-synthesized, multiple-loop oscillators, with the significantly lower cost of single-loop, frequency-synthesized oscillators. The invention also includes certain specific embodiments, described hereinafter, which are particularly simple and efficient.

other features and advantages of the invention will become apparent when the following description is read in conjunction with the accompanying drawings.

DETAILED DESCRIPTION OF THE PREFERRED EMBODIMENT

Figure 1:
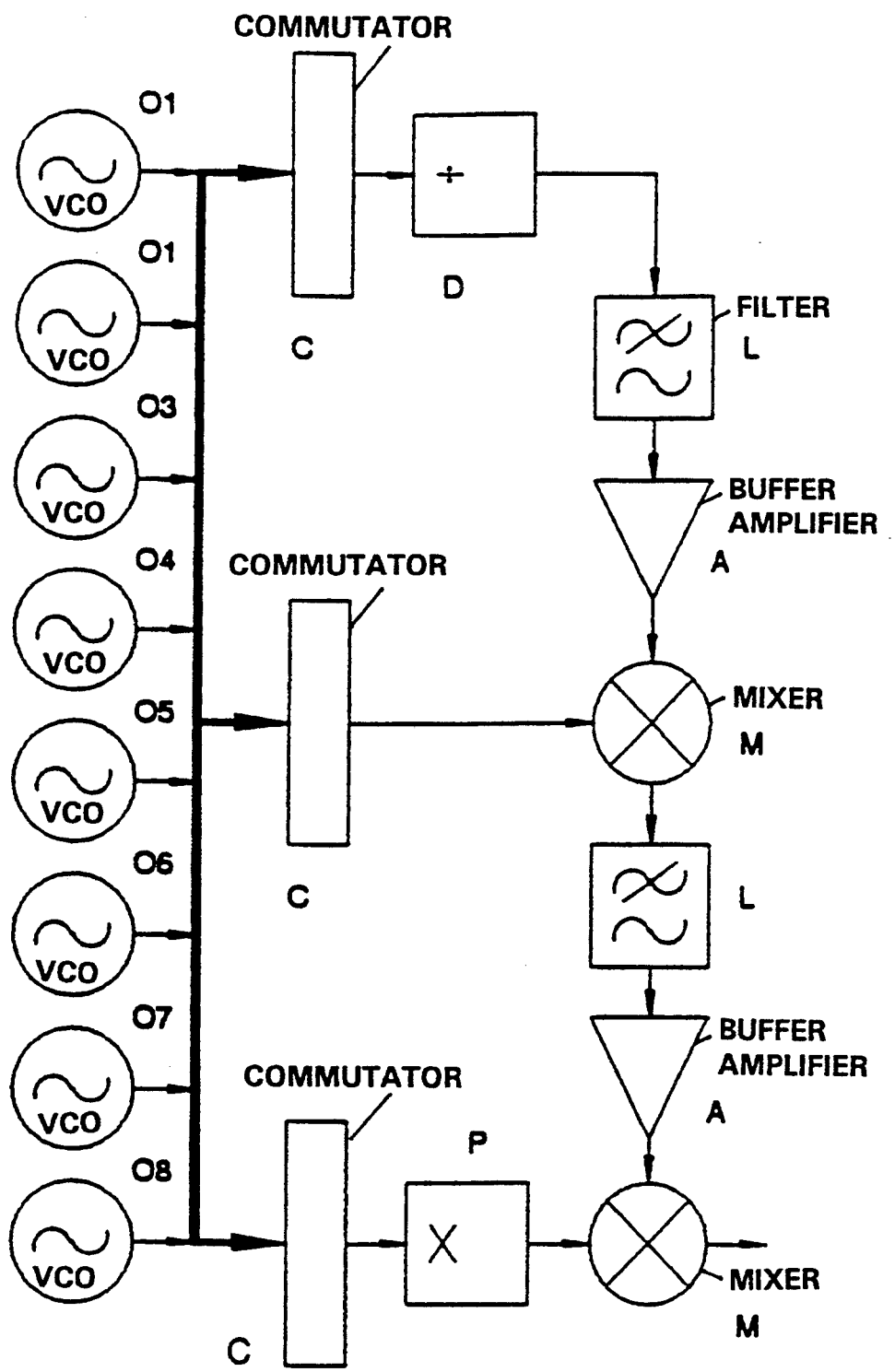
FIG. 1 is a block diagram of a prior art direct frequency synthesis system.
Figure 2:
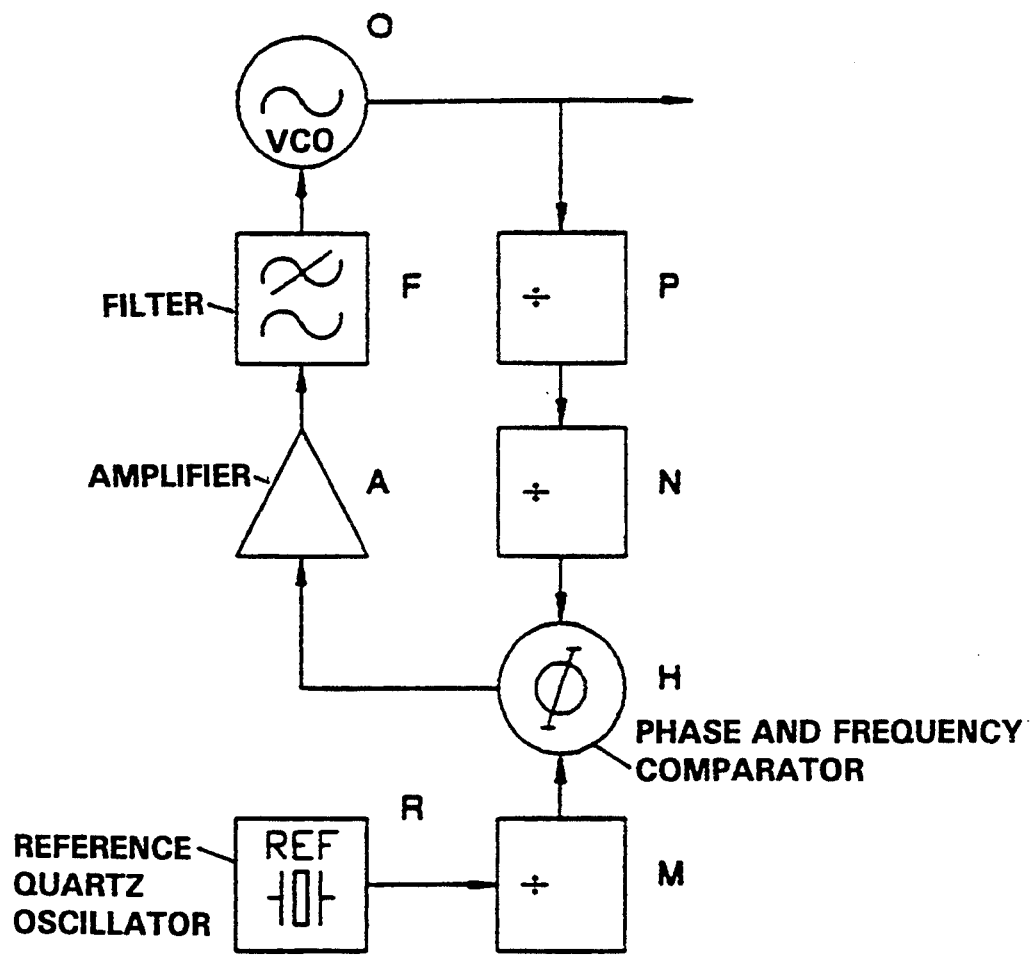
FIG. 2 is a block diagram of a prior art indirect single-loop frequency synthesis system.
Figure 3:
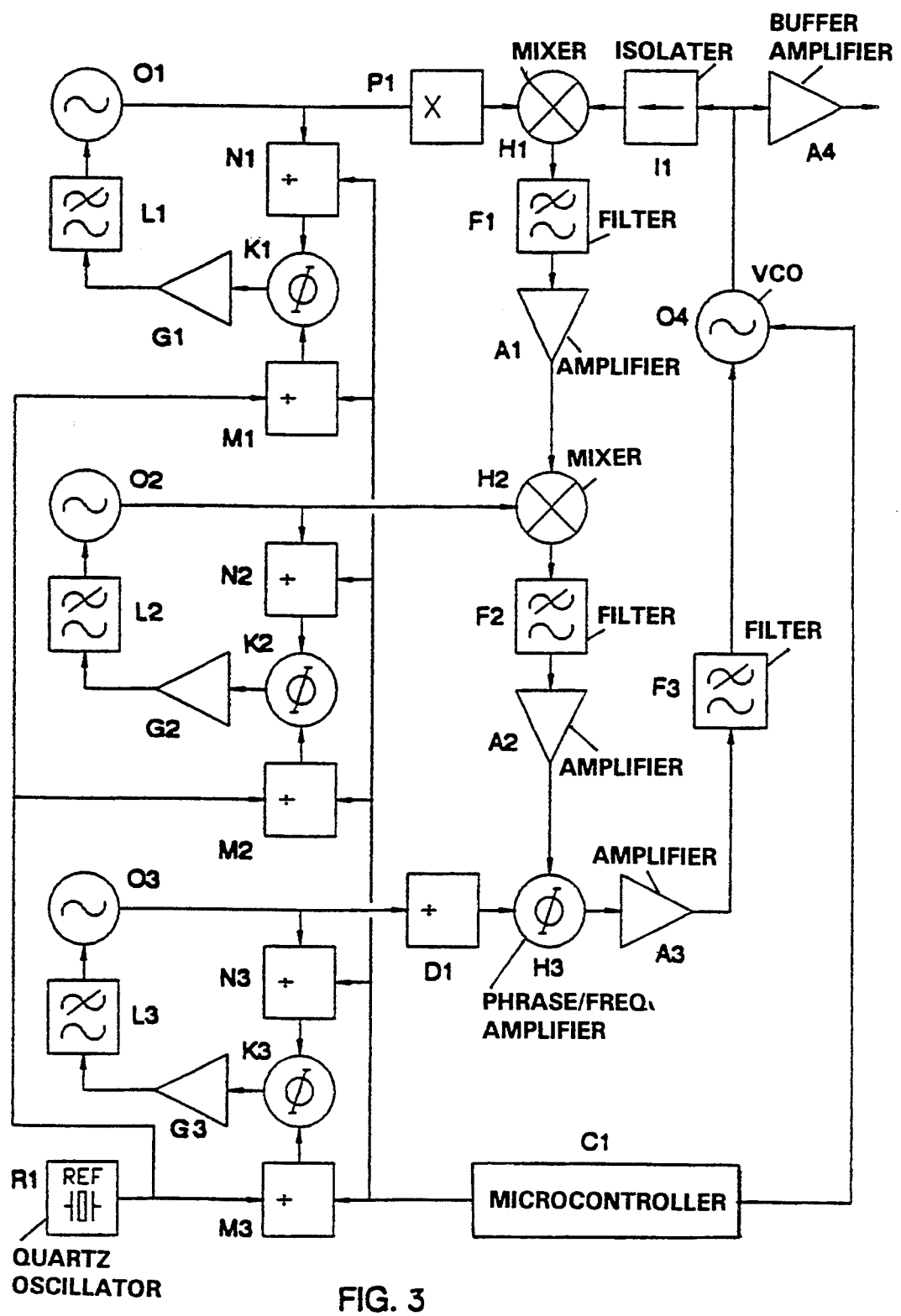
FIG. 3 is a block diagram of a prior art indirect multiple-loop frequency synthesis system.
Figure 4:
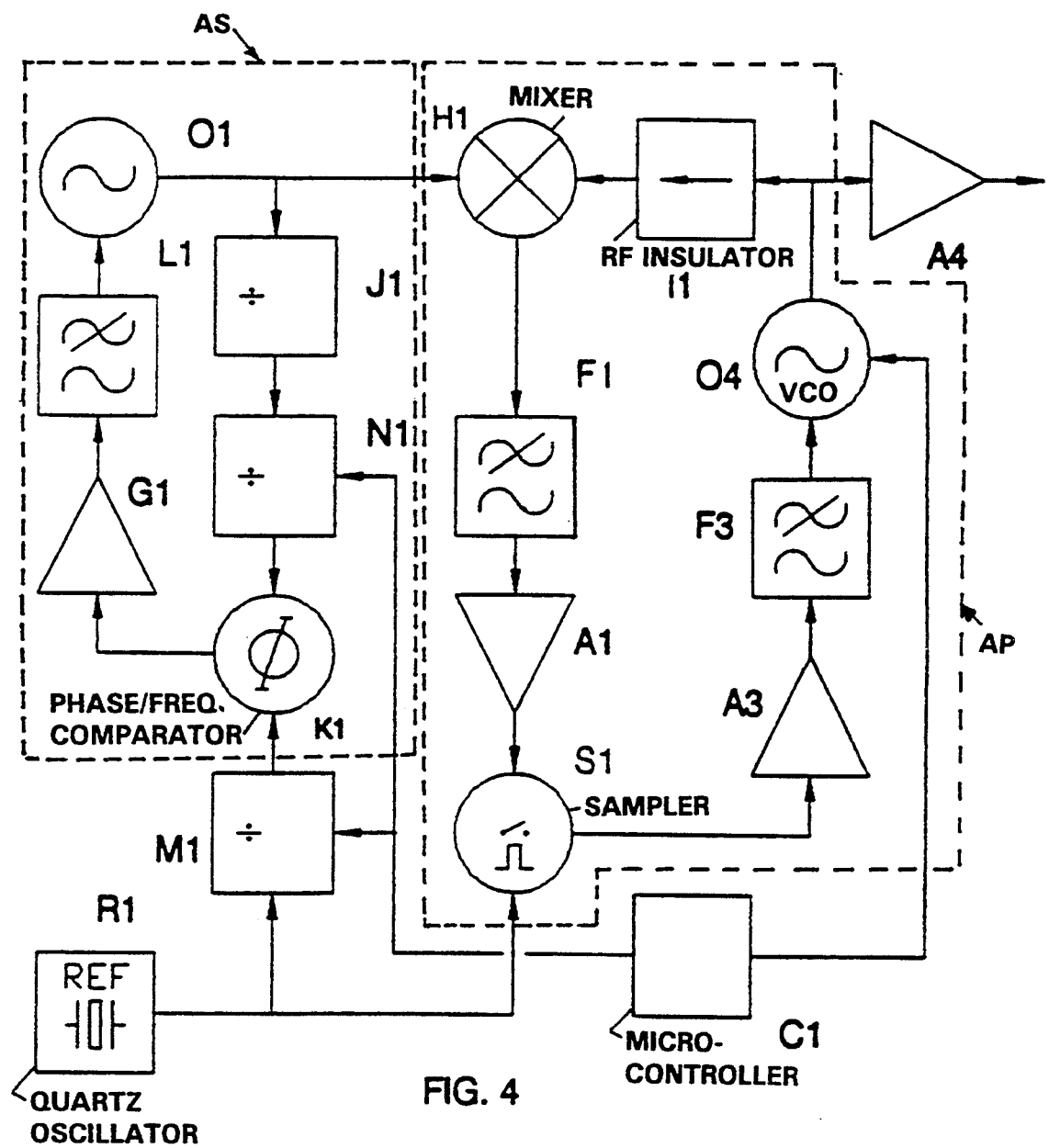
FIG. 4 is a block diagram of one embodiment of the present invention.

FIG. 4 is a block diagram of the circuit of the present invention, which achieves the performance of a complex multiple-loop frequency synthesis oscillator, but with a cost only slightly higher than the cost of a single loop system.

The system of the present invention is formed of a main loop (AP) and a secondary loop (AS). The main loop AP has an oscillator O4 that is formed, according to a feature of the invention, by a low gain factor microwave VCO that covers the entire required frequency band with electronic tuning.

A buffer amplifier A4 is disposed between oscillator O4 and the output of the system. A portion of the signal from oscillator O4 is sent to the mixer H1 through a RF isolator I1, which is necessary to prevent spurious frequencies at the output of the system.

The frequency of oscillator O4 is down-shifted in mixer H1 by mixing the signal with frequencies from an oscillator O1 that constitutes a first section X1 of the secondary loop AS. Oscillator O1, the output of which is determinant upon whether the required performance level is achieved (and thus must be accurate), is a cavity oscillator with very high gain factor, without mechanical tuning, which is electronically tunable in fine steps.

The electronic tuning of oscillator O1 permits the synthesis of very small frequency steps, and allows the stability of the cavity oscillator to be controlled with a quartz reference R1. Section X1 of secondary loop AS is a frequency synthesis single-loop including the programmable dividers N1 and M1, the phase/frequency comparator K1, the low frequency amplifier G1 and the loop filter L1. A fixed frequency divider (prescaler) J1 is preferably disposed upstream from the programmable divider N1. Unlike a traditional single loop frequency synthesis oscillator, in the present invention, the cavity oscillator, not being mechanically tuned, is advantageously much less critical.

The frequency converted by H1 is filtered by F1 and amplified by A1, but in the circuit of the present invention, as it is possible to convert both the lateral higher band and the inferior lateral band, and as it is also possible to obtain the same frequency beat, the intermediate frequency (fi) output from the mixer H1 can range from DC to about 1 GHz. Therefore, oscillator O4 can cover a frequency, e.g. from 1 GHz below to 1 GHz above the frequency of oscillator O1, thereby covering a frequency band of 2 GHz.

The larger frequency steps are obtained by locking (controlling) the above mentioned intermediate frequency, output from A1, to multiples of the values of the reference frequency R1 by means of a low frequency sampling circuit S1 (section X2 of the secondary synthesis loop AS). A3 and F3 are, respectively, an amplifier and a low frequency filter that complete the main control loop.

The microcontroller C1 pretunes the circuit at a frequency close to the desired frequency of oscillator O4 using a digital/analog converter by appropriately programming the programmable dividers N1 and M1.

The circuit of the present invention can be embodied for frequencies ranging from UHF frequencies to higher microwave frequencies that are actually used in telecommunications, advantageously with a single set of circuit components and requiring only the modification of the RF parts, that is O4, A4, I1, H1, O1, J1 for the different frequencies.

Since the element most critical and determinant of overall performance, i.e. oscillator O1, is highly simplified due to the absence of the mechanical tuning, and since the other circuit components can be used over a wide range of frequencies and/or are simple and easily changed, the complexity of the circuit of the present invention (and thus the cost) is not significantly higher than the cost of a single loop frequency oscillator with a mechanically tunable cavity oscillator. To the contrary, as shown below, the performance and practicality of the circuit of the present invention is much higher than the prior art.

The Performance of the Present Invention

1. Oscillation Frequency

It is possible to obtain oscillation frequencies ranging from 1 GHz to 20 GHz using the circuit shown in FIG. 4. To obtain lower frequencies, it is convenient to add a frequency divider at the output. For higher frequencies, a multiplier is added at the output.

2. Synthesizable frequency range

The frequency range of the system depends primarily on the sampler S1 and the multiplication factor applied to the signal from reference R1 (FIG. 4). It is particularly easy and economical to cover 300 MHz below and above the oscillation frequency of oscillator O4; however, by utilizing higher multiplying factors and more sophisticated sampling circuits, it is possible to obtain bands of GHz.

3. Minimum synthesis step

The minimum frequency step depends on the secondary synthesis loop including the cavity oscillator O1

(FIG. 4). The primary limitation is the increase of time required for the synthesis of a new frequency, which is inversely proportional to the minimum step desired.

4. Frequency synthesis time

The frequency synthesis time depends on the speed of microcontroller C1 and on the bandwidth of filter L1, and upon the synthesis step and the division factor of pre-scaler (divider) J1 (FIG. 4). For example, assuming the microcontroller has ended all necessary calculations in microseconds, e.g. 10 $\mu$sec, with a synthesis step of 100 kHz and a prescaler division order 8, a synthesis time of about $500 \times (8/100) + 10 = 50$ $\mu$Sec is obtained.

5. Frequency stability versus temperature

The frequency stability of the system to temperature changes depends solely on the reference oscillator R1. Thus, it is relatively easy to obtain a stability of 5 ppm (parts per million) in the temperature range from $-20°$ to $+70°$ C.

6. Frequency stability versus time (aging)

Since frequency stability over time also depends solely on the reference oscillator R1, it is easy to obtain a stability of 3 ppm (parts per million) per year. In any case, an external adjustment of oscillation frequency can be easily implemented to correct and adjust for changes in frequency over time.

7. Frequency stability versus frequency variations (pushing)

Frequency stability over the frequency range depends again solely on the reference oscillator R1. It is advisable to insert the suitable voltage limiters on the power supply to prevent changes in the power supply voltage from affecting frequency stability. In this way, frequency variations can be kept to tenths or hundredths of ppm/V regardless of variations in the supply voltage.

8. Frequency stability versus output load variations (pulling)

The output frequency of the circuit of the present invention, which depends solely on the value of R1, does not change with changes in load. The isolation provided by the buffer A4 at the output permits the oscillator to run well even in the presence of a total reflection, at any phase, at any load value.

9. Frequency stability in consequence of mechanical stresses (microphonics)

As long as the mechanical stresses are maintained to a relatively low intensity, the microphonics of the present invention depends only on the reference quartz oscillator R1, which therefore is preferably installed on elastic buffers. At higher mechanical stresses, releasing phenomena could occur in the synthesis second loop: O1, J1, N1, K1, G1, L1 (FIG. 4). This phenomenon can be attenuated by adopting the specific circuit details described below, with the goal of obtaining 5 ppm deviation of the frequency in conjunction with shocks of 50 mJ, corresponding to accelerations of about 500 g, having a duration of about 0.1 msec.

10. Phase noise of the oscillation frequency

The single side band phase noise depends on the oscillator O1 and on the multiplication factor of reference R1 in the main synthesis loop band, which is determined by the filter F4, and by the external oscillator O4 (FIG. 4). The device should be correctly dimensioned to obtain at least 85 dBc/Hz at 1 ppm from the carrier, 100 dBc/Hz at 10 ppm and 110 dBc/Hz at 100 ppm and higher values from the main band.

11. Spurious frequencies in the oscillation band

The content of spurious frequencies depends obviously on the quality of the circuit layout; however, the RF isolator I1 (FIG. 4) has a large effect on the content of output spurious frequencies. If the RF isolation of the mixer H1 is equal to 30 dB and that of oscillators O1 and O4 is about equal to the isolation, 50 dB of RF isolation in I1 is necessary to obtain more than 80 dBc at output.

Spurious frequencies can be reduced by slightly modifying the circuit of FIG. 4. Moving J1 to the place of I1, and thereby correspondingly modifying the frequency of oscillator O1, it is possible to carry out the mixing in H1 at a lower frequency (a sub-multiple) than the frequency of oscillator O4, with a consequent reduction of the output spurious frequencies to the detriment of an increase of the total phase noise.

12. Spurious (harmonic) frequencies outside the oscillation band

The harmonic content of oscillator O4 (FIG. 4) is high since the device has a low gain factor and it is further increased by buffer A4 that must also act as a limiter for leveling as far as possible the output power. Therefore, it is desirable to insert a low-pass filter at the RF output, after buffer A4, to limit the harmonic frequencies to under 30 dBc.

13. Transient spurious frequencies during the frequency tuning operations

If the microcontroller C1 stores in memory the voltage/frequency characteristic of oscillator O4, it is possible to disconnect oscillator O4 and buffer A4 during the tuning operations. Therefore, it is possible to limit the emission of spurious frequencies during tuning operations to under 100 dBc.

14. Output power—its variation in band and in temperature

Device performance with regard to output power depends solely on the buffer A4 (FIG. 4). With the appropriate buffer, it is easy to obtain 15 dBm of output power with 0.5 dB variation in temperature and 1.5 dB variation in band, performance levels typical in the field of local oscillators for microwave communication systems.

15. Power Requirements

The parts that contribute in greater measure to drawing power are the prescaler J1, the oscillators O1 and O4 and the buffer A4 (FIG. 4). The circuit of the present invention maintains consumption at a relatively low level, from about 2 watts under 2 GHz to about 5 watts over 10 GHz.

16. Mechanical dimensions

The simplicity of the circuit of the invention results in greatly reduced mechanical dimensions by using conventional printed circuit technology, namely printed circuit on glass fiber for the lower frequency signals and on fluorine polymers (teflon) for the microwave signals. It is possible in this way to obtain dimensions of about 200 cubic centimeters without using sophisticated techniques of circuit integration.

Specific Circuit Details and Alternative Embodiments

For a better understanding of the invention, it is helpful to break the circuit schematic of FIG. 4 into two loops, the main loop (AP), formed by O4, I1, H1, F1, A1, S1, A3, and F3 (FIG. 5) and the secondary loop (AS) (FIG. 6) formed by O1, J1, N1, K1, G1 and L1, where K1 is a phase/frequency comparator.

The amplifier A4 is not necessary for proper operation and is used only to adjust the output power to the required value.

The reference oscillator R1 is a conventional quartz oscillator, preferably thermostatically controlled for obtaining the best stability. The divider M1 is used only for obtaining the minimum required synthesis step, equal to the frequency of R1 divided by M1 and multiplied by J1, and it is normally disposed inside of a single integrated circuit together with N1 and K1, readily available on the market from various suppliers at low cost.

The microcontroller C1 has the task of transforming the desired oscillation frequency, input in binary code transmitted in series or in parallel, into actions to be taken on the main and secondary synthesis loops. Therefore, microcontroller C1 preferably includes, in addition to standard arithmetic functions, memory, etc., also analog inputs and outputs, a counter/timer, at least a serial port and a parallel port to interface with external devices, and further other digital inputs and outputs for device control signals.

1. The main synthesis loop AP

Figure 5:
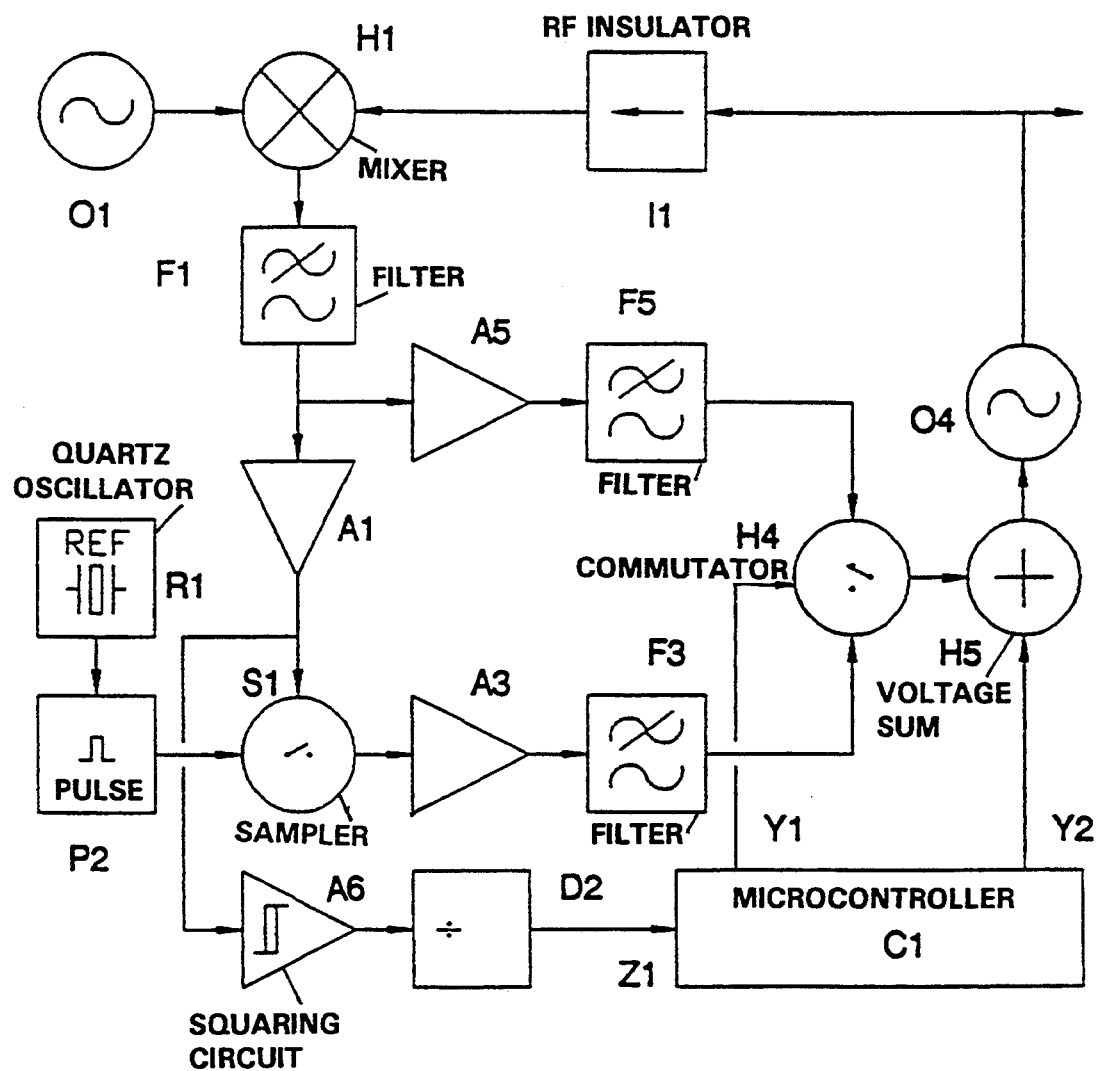
FIG. 5 is a block diagram showing details of the main synthesis loop of the present invention.

Although the circuit schematic of FIG. 4 can be readily implemented as a workable system, the alternative embodiment shown in FIG. 5 provides optimal performance without requiring more complex individual components. The components of the embodiment of FIG. 5 are now described in greater detail.

Microwave VCO O4 of FIG. 5 can be implemented without serious difficulty. The active component of VCO O4 is a transistor for the lower frequencies and a FET for the higher frequencies. The frequency tuning is achieved by a varactor diode of the hyper-abrupt type. Normally, it is not necessary to use a YIG (ytrium-iron garnet) resonator. The high impedance input of said varactor forms the node of voltage sum H5.

The tuning linearity, in MHz/V, is not particularly important, as a doubling of the sensitivity between the high and low band limits can be accepted. It is not necessary to control the stability in temperature. It is sufficient that the circuit covers the desired frequency range in the anticipated temperature range.

The output power can be a few mW, which is sufficient for driving the mixer H1, with range variations amounting to a few dB. The phase noise of the oscillator O4 influences the performance of the entire device only when it is outside of the frequency band of the control loop, i.e. on the order of 300 or 400 KHz. Therefore, it is easy to obtain the required performance since the frequency of interest is so much higher than the carrier frequency.

The RF isolator I1 acts solely to prevent RF residue from the oscillator O1, which passes through the mixer H1, from reaching the output. RF isolator I1 is preferably formed of stages of transistors or FETs at the lower frequencies and with one or two passive isolators in cascade on ferrites or garnets at the higher frequencies. It is easy to appreciate that about 50 dB isolation is sufficient for assuring a residue lower than 80 dBc at output.

The RF isolator I1 can be replaced with a frequency divider, e.g. a divide-by-4 divider. In this case, the oscillator O1 and the mixer H1 work at ¼ of the frequency of oscillator O4, and the spurious frequency at the output is caused only by distortions that generate a fourth harmonic of the frequency of oscillator O1, normally quite low. However, in this case, the phase noise close to the carrier frequency increases by 4 times, that is, 12 dB.

Mixer H1, preferably formed of Shottky-junction diodes, is of the simple balanced type, and it is necessary to adjust the isolation between the two radio frequency inputs and the distortion of the output in low frequency.

The signal at the output of the mixer H1, that includes a DC signal for locking of the oscillator O4 to the frequency of oscillator O1, should have relatively low harmonic and spurious distortions together with as high a power level as possible. It is easy to obtain a power level of about 0.1 mW, which is sufficient, with a harmonic content lower than 30 dBc.

The low-pass filter F1, formed simply of capacitors and inductors mounted in an integrated circuit, blocks the passage of unwanted high radio frequency signals. The amplifier A1 amplifies, without adding distortion, the signal coming from H1 ranging from DC up to frequencies in the order of 300 MHz (for a total synthesizer coverage of 2×300=600 MHz) or 1 GHz (for a coverage of 2 GHz).

The so-described component causes serious problems when a simple embodiment is desired; therefore, it is convenient to break the loop in two ways: one way from DC up through several hundreds of KHz directed towards A5 and the other way from hundreds of KHz up to the higher band limit directed towards A1. When it is desired to lock oscillator O4 to the frequency of oscillator O1, by observing that the mixer H1 acts also as phase comparator, the complex A5 and F5, formed of an integrated operational amplifier, that includes also the loop filter F5 in its circuitry, is the error amplifier of the phase locking loop and is consequently dimensioned, according to VCO sensitivity (in MHz/V) and to the characteristic of the phase comparator (in mV/rad). In this case, the microcontroller C1, via its digital output Y1, shunts the electronic commutator H4, formed of a simple CMOS integrated circuit CMOS, thereby connecting A5/F5 to H5.

On the contrary, the microcontroller C1 shunts the commutator H4 to the other way in the case when it is desired to drive the oscillator O4 at frequencies that are a distance of integral multiples of the reference frequency R1 from the frequency of oscillator O1 (both to higher or lower frequencies). In this case, the detection of phase errors is made by means of a sampling circuit S1.

Although it is possible to use a mixer for this purpose, better performance and a greater simplicity are obtained using a "sample and hold" circuit formed of a single fast MOSFET for frequencies up to about 500 MHz; if higher frequencies are required, it is necessary to use Shottky diodes or MOSFETs. The control signal of S1 is shunted from the reference R1 by a pulse generating circuit P2.

It is easy to make this circuit with simple logic gates NAND or NOR with fast CMOS logic for pulses of some nanoseconds, silicon ECLs for pulses of about 1 nanosecond or made of GaAs for hundreds of picoseconds. Obviously, it is also possible, although less practical, to make the circuit using a step diode.

The combination of P2 and S1 can also be considered as a harmonic converter in which P2 is the line generator and S1 is the mixer that makes the phase comparison.

Although the sampler S1 is suitable for processing DC current, such operation is expensive; therefore, amplifier A1 is preferably made with amplification stages coupled in alternated current, from 100 KHz to the highest value of the desired frequency band.

The gain is about 20 dB, as the sampler must supply a signal of about 1 $V_{peak-peak}$, and the output impedance (Za) is preferably as small as possible (50 Ohms is acceptable).

The circuit can be formed of integrated circuits.

The amplifier A3 and filter F3 assembly is completely similar to A5/F5 assembly, but in this case the signal comes from the sampler S1.

The input impedance (Zb) of A3 must be very high, so that the capacitor (Ca) of "sample and hold" circuit S1 is not charged excessively. If Ta is the duration of pulses and Tb is its repetition period (equal to the inverse of R1 frequency), then Za*Ca<<Ta and Zb*Ca>>Tb.

The microcontroller C1 acts to pretune oscillator O4 at the desired frequency with an error lower than the capture band of the phase control loop (determined substantially by the filters F3 or F5) and uses for this purpose an analog output Y2 (digital/analog converters).

Instead of using the memorization of voltage/frequency characteristics of oscillator O4 at the various temperatures (this operation being possible but also increasing the calibration and test operations), it is preferable to directly measure the frequency of oscillator O4 using the input of counter Z1 of C1 and considering that the frequency of oscillator O1 is known, it being determined by the programming of the secondary loop.

As Z1 usually accepts rather low frequencies, (maximum 1 MHz), it is convenient to divide the output frequency at A1, that can reach 1 GHz, using the prescaler D2. The frequency dividers require a minimum ramp time of the input signal to correctly perform the division; therefore, it is necessary to dispose upstream a squaring circuit A6, made with differential transistor stages and/or NAND or NOR logic gates. The gain of squaring circuit A6 must be rather high, about 60 dB, as it must bring the ramp time of 100 uSec/V (corresponding to the lower frequency under which the loop is locked) to 10 nSec/100 mV (corresponding to the minimum counting frequency).

Therefore, it is preferable to survey during the calibration phase, also in an approximative manner, the voltage/frequency characteristic of VCO O4, with the purpose of making the pre-tuning operations faster and avoiding the emission of spurious waves keeping off VCO O4, and the following buffer A4, until the remaining circuit parts are all running at the new frequency.

Therefore, the main synthesis loop is well-established both in its functions and in its embodiment modality. It can be made using simple and economical circuitry, purchased easily in integrated form on the market.

2. The secondary synthesis loop AS

Figure 6:
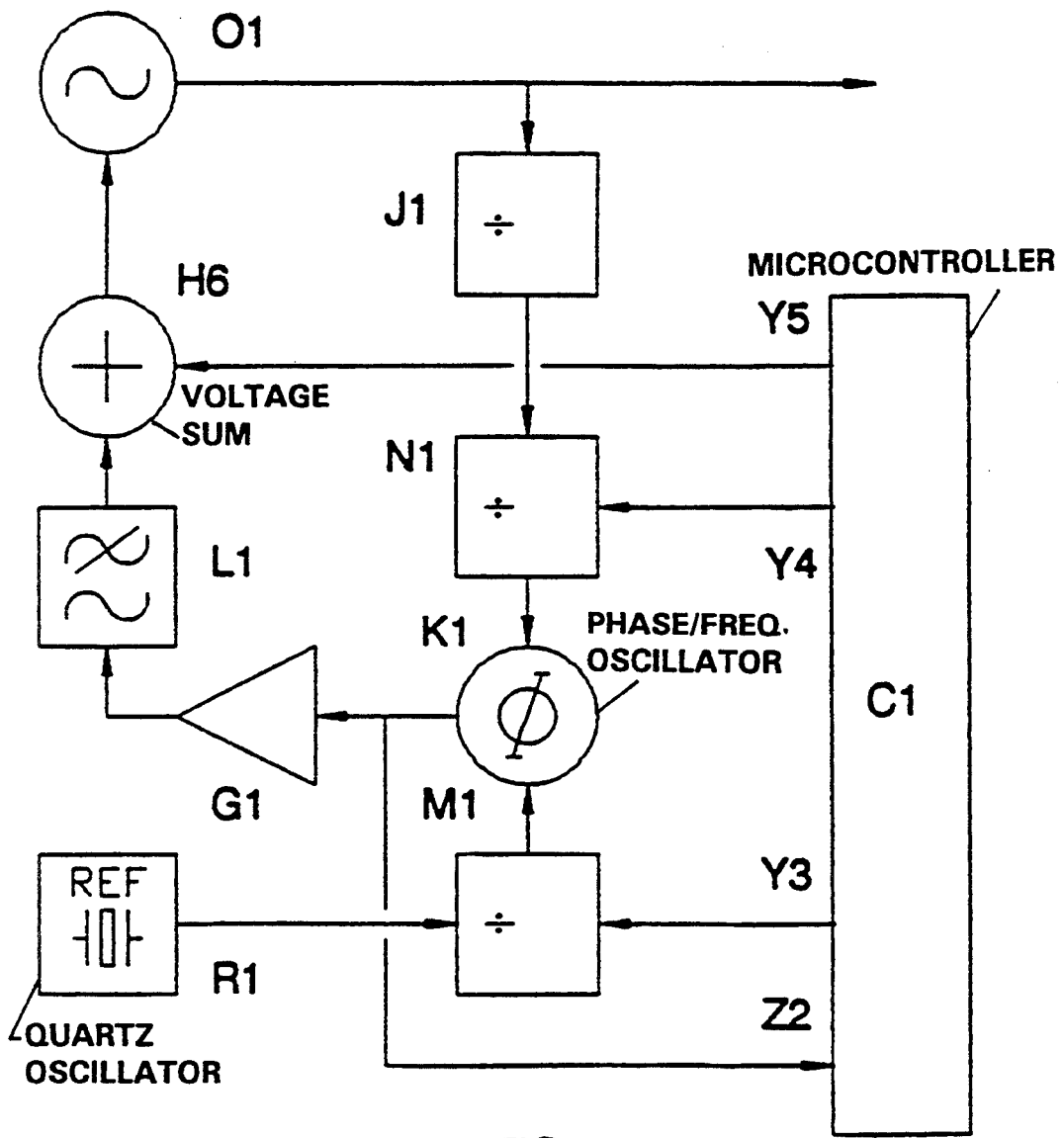
FIG. 6 is a block diagram of the present invention showing details of the secondary synthesis loop.

FIG. 6 shows the secondary synthesis loop (AS) in detail, this loop being a simple indirect synthesis loop, except that certain simplifications are possible since the required synthesis band is very narrow, exactly equal to the reference frequency R1.

The more critical circuit component is the oscillator O1, as its performance directly influences the performance of the complete device. Oscillator O1 is preferably formed of a dielectric resonator oscillator in the mode $TE_{O1d}$ for frequencies higher than 2.5 GHz and with a coaxial dielectric resonator oscillator for lower frequencies.

Obviously, the resonating elements, or cavities, can be formed in a number of different ways, but the above indicated resonator assures a suitable gain factor in a compact circuit with low microphonics. The dielectric resonator is coupled with a varactor diode, and it shall be selected among the ones having a gain factor as high as possible, and it should have a weak coupling in order to avoid damaging the gain of the resonator.

The required frequency deviation is equal to the reference frequency R1 and can be easily obtained with the two oscillator types indicated above.

The oscillator does not require mechanical tuning, and this greatly simplifies its implementation, as it is not necessary to prevent all quick frequency springs, caused by material settings, that are caused by mechanical tuning.

The active component is a bipolar transistor or a low level FET.

Finally, the oscillator O1 is of the low noise type having high stability with electronic frequency control.

The programmable dividers N1 and M1 and the phase/frequency comparator K1 are normally used within a single integrated circuit, available from various suppliers at low cost.

As the input of N1 does not normally exceed by a limited value 1 GHz, it is necessary to insert upstream a fixed divider J1 which is commercially available from various suppliers, such as an integrated circuit mounted on silicon for signal up to 2.5 GHz or on GaAs for signals up to 14 GHz. Further, it can be made with a parametric varactor divider or with a free oscillator locked in subharmonic frequency by injection for frequencies even higher than 20 GHz.

It is also possible to down-shift the frequency of oscillator O1 with a further mixer and a further oscillator, but this increases the circuit complexity. In this case, the performance of the circuit is, however, deteriorated in terms of noise and stability by the same multiplication factor.

The error amplifier G1, formed of a single low frequency operational amplifier, also includes the loop filter L1 in its components. Its bandpass is very low, on the order of 100 MHz, and in any case lower than a hundredth of the reference frequency R1 divided by M1.

Although unnecessary, it is useful to add a clamp circuit that limits the voltage variation at output of A1 to some tenths of mV. In fact, if the loop becomes unlocked, due, e.g. to mechanical vibrations, the amplifier A1, amplifying the error, in absence of the clamp, could drive the oscillator on the order of MHz beyond the desired frequency, causing an interruption of the operation of the entire circuit. The clamp circuit, on the other hand, prevents the oscillator from moving more than 10 KHz from the desired frequency, or less, if necessary, to avoid interruption of circuit operation.

The microcontroller C1 performs a pre-tuning of the desired frequency. It measures the indicative voltage of the frequency error at output of K1 in its analog input Z2, and, using its analog output Y5, it applies a voltage to the sum node H6 to bring the oscillation frequency within the loop capture band, limited by the clamp circuit. The node H6 is simply the input, at very high impedance, of the varactor diode of oscillator O1.

Therefore, the secondary synthesis loop is well equipped to perform the functions required. The only critical components of the secondary synthesis loop are the cavity oscillator and the frequency divider. Other than these, all other components are all simple and economical, purchased easily on the market in integrated form.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

We claim:

1. A system for generating high-frequency signals, comprising:
   (a) a main loop including an electronically tuned low gain oscillator with an output frequency tunable in relatively wide steps over a relatively wide frequency range;
   (b) a secondary loop including:
      (i) an indirect synthesis single-loop section having an electronically tuned high gain oscillator formed of a cavity resonator with an output frequency tunable over a relatively narrow frequency range in relatively small frequency steps; and
      (ii) a direct frequency synthesis section; and
   (c) a quartz reference for emitting a frequency from which frequencies for controlling the low gain and high gain oscillators are synthesized;
   wherein the main loop and the secondary loop are interconnected such that the output frequency of the high gain oscillator is mixed with the output frequency of the low gain oscillator, the mixed frequency signal being filtered, amplified, and locked to a multiple value of the quartz reference frequency to produce an output frequency.

2. A system as recited in claim 1, wherein the direct frequency synthesis section of the secondary loop includes a pulse generator coupled to the quartz reference, the pulse generator in turn being coupled to a sampler.

3. A system as recited in claim 1, wherein the direct frequency synthesis section of the secondary loop includes a line generator coupled to the quartz reference, the line generator being coupled in turn to a phase mixer/comparator.

* * * * *